United States Patent
Chen et al.

(10) Patent No.: US 10,677,842 B2
(45) Date of Patent: Jun. 9, 2020

(54) DUT TESTING WITH CONFIGURABLE COOLING CONTROL USING DUT INTERNAL TEMPERATURE DATA

(71) Applicant: Advantest Corporation, Tokyo (JP)

(72) Inventors: Leon Chen, San Jose, CA (US); Rebecca Toy, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 4 days.

(21) Appl. No.: 15/606,297

(22) Filed: May 26, 2017

(65) Prior Publication Data

US 2018/0340974 A1    Nov. 29, 2018

(51) Int. Cl.
*G01R 31/28* (2006.01)
*G11C 29/56* (2006.01)
*G01R 1/04* (2006.01)

(52) U.S. Cl.
CPC .... *G01R 31/2877* (2013.01); *G11C 29/56016* (2013.01); *G01R 1/0458* (2013.01); *G01R 31/2891* (2013.01); *G11C 29/56* (2013.01)

(58) Field of Classification Search
CPC ............ G01R 31/2877; G01R 31/2891; G01R 1/0458; G11C 29/56016; G11C 29/56
See application file for complete search history.

(56) References Cited

U.S. PATENT DOCUMENTS

| | | | |
|---|---|---|---|
| 5,309,090 A | 5/1994 | Lipp | |
| 5,406,212 A | 4/1995 | Hashinaga et al. | |
| 5,788,084 A | 8/1998 | Onishi et al. | |
| 5,954,832 A | 9/1999 | LeBlanc | |
| 5,966,021 A | 10/1999 | Eliashberg et al. | |
| 5,983,380 A | 11/1999 | Motika et al. | |
| 6,043,671 A | 3/2000 | Mizuta | |
| 6,104,183 A | 8/2000 | Kobayashi et al. | |
| 6,157,201 A | 12/2000 | Leung, Jr. | |
| 6,407,567 B1 | 6/2002 | Etter | |
| 6,487,463 B1 | 11/2002 | Stepp, III | |
| 6,498,899 B2 | 12/2002 | Malinoski et al. | |
| 6,518,782 B1 | 2/2003 | Turner | |
| 6,577,148 B1 | 6/2003 | DeHaven et al. | |
| 6,583,638 B2 | 6/2003 | Costello et al. | |
| 6,735,726 B2 | 5/2004 | Muranaka et al. | |
| 6,760,873 B1 | 7/2004 | Hao et al. | |
| 6,993,418 B2 * | 1/2006 | Stewart .............. | G05D 23/1931 700/153 |
| 7,103,495 B2 | 9/2006 | Kiryu | |

(Continued)

FOREIGN PATENT DOCUMENTS

| | | |
|---|---|---|
| JP | 2013190396 | 9/2013 |
| KR | 1020150019102 | 2/2015 |

*Primary Examiner* — Dominic E Hawkins

(57) ABSTRACT

New cooling control techniques suitable for use in the testing of devices are disclosed. The new cooling control techniques are an improvement over existing cooling control techniques because the new cooling control techniques utilize inputs that are more representative of actual thermal conditions experienced by a DUT (device under test) and/or are more representative of various other parameters, such as DUT power consumption/dissipation, during testing. Also, the new cooling control techniques offer flexibility with respect to the cooling control algorithm to employ for the DUT during testing.

19 Claims, 7 Drawing Sheets

(56) References Cited

U.S. PATENT DOCUMENTS

| | | |
|---|---|---|
| 7,443,184 B2 | 10/2008 | Norris |
| 9,471,117 B1 | 10/2016 | Spangler |
| 2002/0121913 A1 | 9/2002 | Miller et al. |
| 2004/0103355 A1 | 5/2004 | Correale, Jr. et al. |
| 2006/0071678 A1* | 4/2006 | Norris ................ G01R 31/2868 324/750.05 |
| 2007/0057686 A1* | 3/2007 | Suga .................. G01R 31/2875 324/750.07 |
| 2008/0088301 A1* | 4/2008 | Tan .................... G01R 31/2867 324/750.06 |
| 2008/0307282 A1* | 12/2008 | Dono ............. G01R 31/318533 714/736 |
| 2009/0183045 A1* | 7/2009 | Yao .................. G01R 31/31908 714/738 |
| 2011/0172807 A1 | 7/2011 | Merrow |
| 2012/0225366 A1 | 9/2012 | Suto et al. |
| 2012/0239976 A1 | 9/2012 | Cometti et al. |
| 2014/0103947 A1 | 4/2014 | Phan et al. |
| 2016/0139198 A1 | 5/2016 | Park et al. |
| 2017/0115339 A1* | 4/2017 | Ho .................... G01R 31/2874 |

\* cited by examiner

DUT TESTING WITH CONFIGURABLE COOLING CONTROL USING DUT INTERNAL TEMPERATURE DATA

FIELD

Embodiments of the present invention relate to testing of devices. More specifically, embodiments relate to cooling control techniques suitable for use in the testing of devices, e.g., electronic devices.

BACKGROUND

During the testing of electronic devices, heat is generated and emitted to the surrounding external environment by the electronic devices. Managing this heat is a challenging task during the testing of the electronic devices. Numerous cooling mechanisms exist to dissipate the heat and to cool the electronic devices. There is a wide cost range for these cooling mechanisms. Each cooling mechanism has its advantages and deficiencies.

Some heat is required to warm the electronic device during testing. Cooling mechanisms are used to regulate the temperature of the electronic device at a desired temperature or desired temperature range during testing.

Factors that influence the effectiveness of a cooling mechanism include cooling capacity and cooling control of the cooling mechanism. Cooling capacity generally refers to an amount of heat the cooling mechanism is able to dissipate from a volume or an area within a time interval. Cooling control generally refers to aspects of manipulating the operation of the cooling mechanism to address current environmental conditions. As the manufacturing phase of electronic devices matures to volume production, the testing phase is pressured to adapt new techniques for cooling and for cooling control that are better suited for performing volume testing of electronic devices and that conform to testing specifications of designers and manufacturers.

SUMMARY

New cooling control techniques suitable for use in the testing of devices are disclosed. The new cooling control techniques are an improvement over existing cooling control techniques because the new cooling control techniques utilize inputs that are more representative of actual thermal conditions experienced by a DUT (device under test) and/or are more representative of various other parameters, such as DUT power consumption/dissipation, during testing. Also, the new cooling control techniques offer flexibility with respect to the cooling control algorithm to employ for the DUT during testing. Further, the new cooling control techniques are well suited for the testing of different types of devices (or DUTs) including, but not limited to, network cards, graphics cards, chips, microprocessors, hard disk drives (HDD), and solid state drives (SSD).

Better representation of actual thermal conditions experienced by the DUT and/or of various other parameters, such as DUT power consumption/dissipation, during testing is achieved by using internal temperature data from one or more internal temperature sensors of the DUT in the new cooling control techniques. Advantageous information (e.g., proprietary, confidential, and/or secret information) related to the internal temperature sensor of the DUT is unrevealed outside of the DUT during testing. Flexibility with respect to the cooling control algorithm employed for the DUT during testing permits utilization of a predetermined cooling control algorithm when desired, or permits utilization of a custom cooling control algorithm when desired in the new cooling control techniques, where the custom cooling control algorithm may be provided by a test user, device designer, or device manufacturer. The custom cooling control algorithm may be integrated into a testing apparatus in an automated and seamless manner. In an embodiment, it may be sufficient for the test user, device designer, or device manufacturer to supply the custom cooling algorithm, code, data, and/or files (e.g., configuration file(s)) that the testing apparatus accesses during a set-up process to automatically accept the internal temperature data from the internal temperature sensor and use the custom cooling algorithm in lieu of the predetermined cooling control algorithm (e.g., the default cooling control algorithm).

In one embodiment, a testing apparatus comprises a DUT (device under test) receiver operable to receive and secure DUT(s). The DUT(s) includes at least one internal temperature sensor operable to generate internal temperature data during testing. The testing apparatus further comprises a cooling control module operable to execute a predetermined cooling control algorithm with temperature data to obtain an algorithm result and operable to generate a cooling control signal based on the algorithm result during testing of the DUT(s). The temperature data is selectable from the internal temperature data and external temperature data of a surrounding environment external to and adjacent to the DUT(s). In addition, the testing apparatus also comprises a cooling mechanism coupled to the cooling control module and operable to cool the DUT(s) based on the cooling control signal. The external temperature data may originate from an external temperature sensor that may operate adjacent to the DUT(s).

In another embodiment, a testing apparatus comprises a DUT (device under test) receiver operable to receive and secure DUT(s). The DUT(s) includes at least one internal temperature sensor operable to generate internal temperature data during testing. The testing apparatus further comprises a custom cooling control module operable to execute a custom cooling control algorithm dependent on the DUT(s) with the internal temperature data from the DUT(s) to obtain an algorithm result and operable to generate a cooling control signal based on the algorithm result during testing of the DUT(s). Further, the testing apparatus also comprises a cooling mechanism operable to cool the DUT(s) based on the cooling control signal from execution of the custom cooling control algorithm. The external temperature data may originate from an external temperature sensor that may operate adjacent to the DUT(s). The testing apparatus may be operable to execute a predetermined cooling control algorithm.

In yet another embodiment, a method comprises initiating performance of a testing routine on DUT(s) (device(s) under test). The DUT(s) includes internal temperature sensor(s). The method further comprises measuring internal temperature of the DUT(s) by using the internal temperature sensor(s) to generate internal temperature data. In addition, the method also comprises executing a cooling control algorithm with temperature data to obtain an algorithm result. The temperature data is selectable from the internal temperature data and external temperature data of a surrounding environment external to and adjacent to the DUT(s). Further, the method also comprises generating a cooling control signal based on the algorithm result and cooling the DUT(s) based on the cooling control signal. The external temperature data may originate from an external temperature sensor that may operate adjacent to the DUT(s).

BRIEF DESCRIPTION OF THE DRAWINGS

The accompanying drawings, which are incorporated in and form a part of this specification, illustrate embodiments, together with the description, serve to explain the principles of the disclosure.

DETAILED DESCRIPTION

Figure 1:
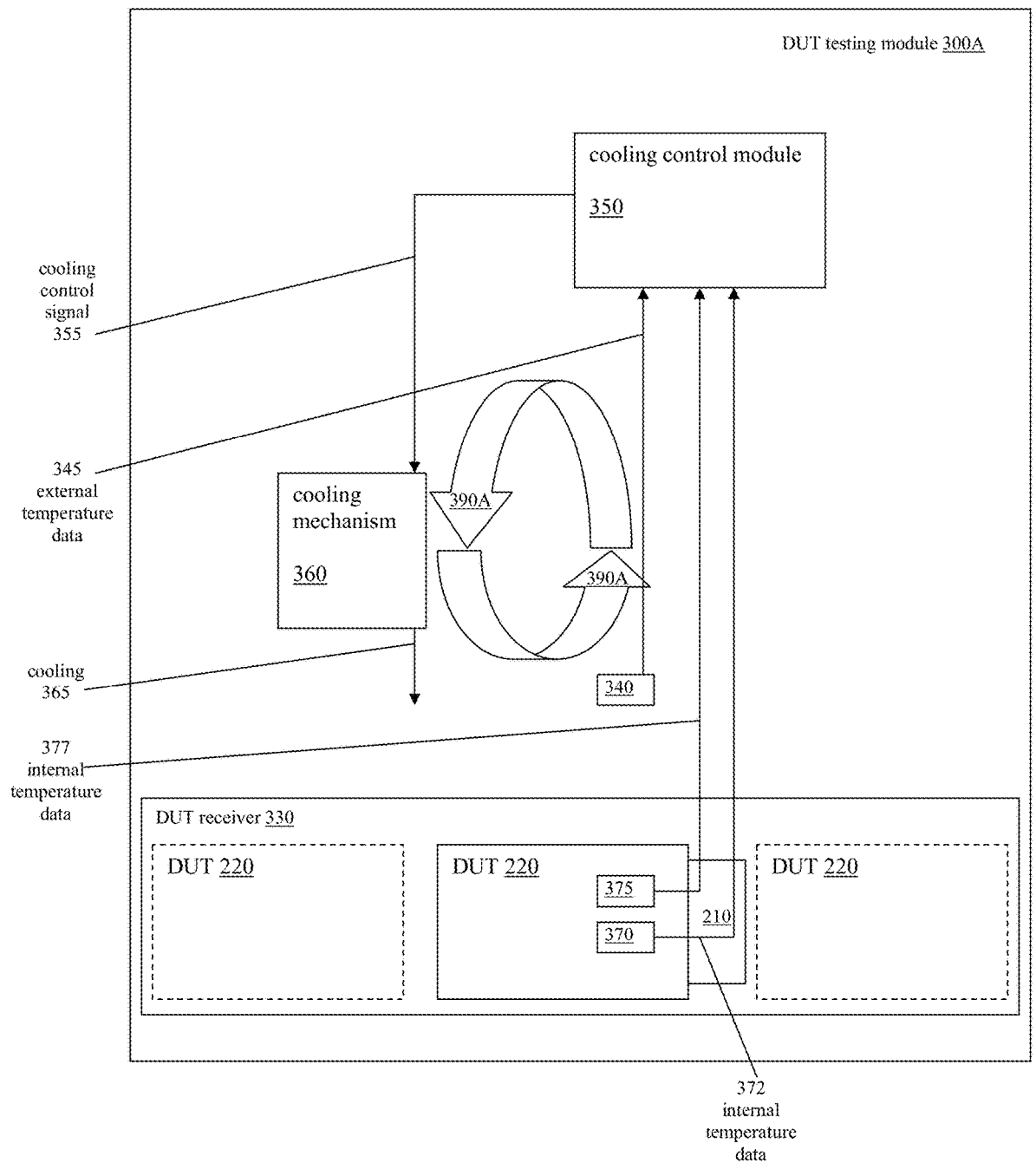
FIG. 1 depicts a first cooling control loop in a DUT (device under test) testing module in accordance with an embodiment.

Reference will now be made in detail to embodiments, examples of which are illustrated in the accompanying drawings. While the disclosure will be described in conjunction with these embodiments, it should be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description, numerous specific details are set forth in order to provide a thorough understanding. However, it will be recognized by one of ordinary skill in the art that embodiments may be practiced without these specific details.

New cooling control techniques suitable for use in the testing of devices are disclosed. The new cooling control techniques are an improvement over existing cooling control techniques because the new cooling control techniques utilize inputs that are more representative of actual thermal conditions experienced by a DUT (device under test) and/or are more representative of various other parameters, such as DUT power consumption/dissipation, during testing. Also, the new cooling control techniques offer flexibility with respect to the cooling control algorithm to employ for the DUT during testing. Either a predetermined cooling control algorithm or a custom cooling control algorithm may be executed for the DUT during testing. Further, the new cooling control techniques are well suited for the testing of different types of devices (or DUTs) including, but not limited to, network cards, graphics cards, chips, microprocessors, hard disk drives (HDD), and solid state drives (SSD).

Better representation of actual thermal conditions experienced by the DUT and/or of various other parameters, such as DUT power consumption/dissipation, during testing is achieved by using internal temperature data from an internal temperature sensor of the DUT in the new cooling control techniques. Advantageous information (e.g., proprietary, confidential, and/or secret information) related to the internal temperature sensor of the DUT is unrevealed outside of the DUT during testing. Flexibility with respect to the cooling control algorithm employed for the DUT during testing permits utilization of a predetermined cooling control algorithm when desired or a custom cooling control algorithm when desired in the new cooling control techniques, where the custom cooling control algorithm may be provided by a test user, device designer, or device manufacturer. The custom cooling control algorithm is integrated into a testing apparatus in an automated and seamless manner. In an embodiment, it may be sufficient for the test user, device designer, or device manufacturer to supply the custom cooling algorithm, code, data, and/or files (e.g., configuration file(s)) that the testing apparatus accesses during a set-up process to automatically accept the internal temperature data from the internal temperature sensor and use the custom cooling algorithm in lieu of the predetermined cooling control algorithm (e.g., the default cooling control algorithm).

Figure 3:
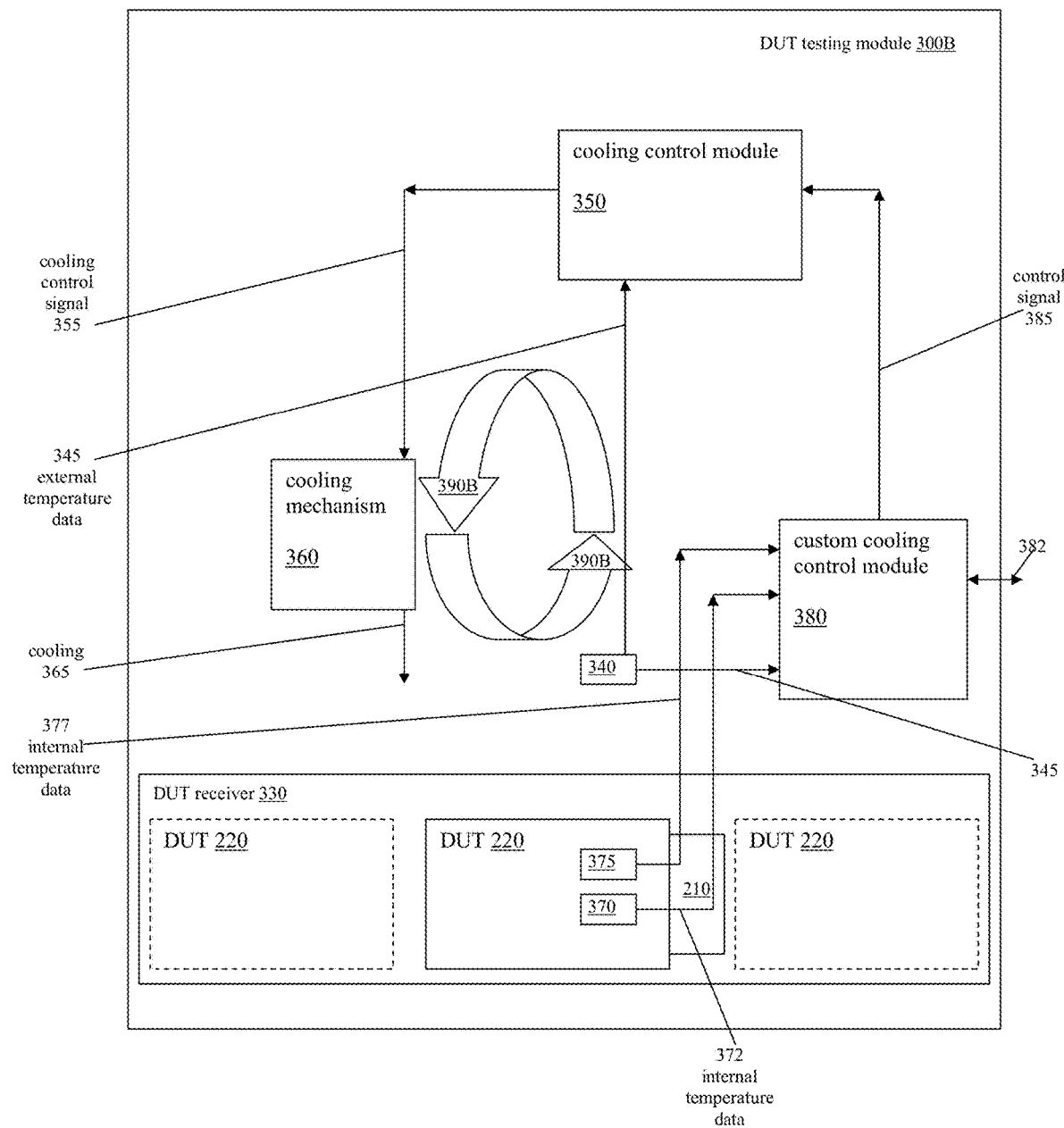
FIG. 3 illustrates a second cooling control loop in a DUT testing module in accordance with an embodiment.
Figure 5:
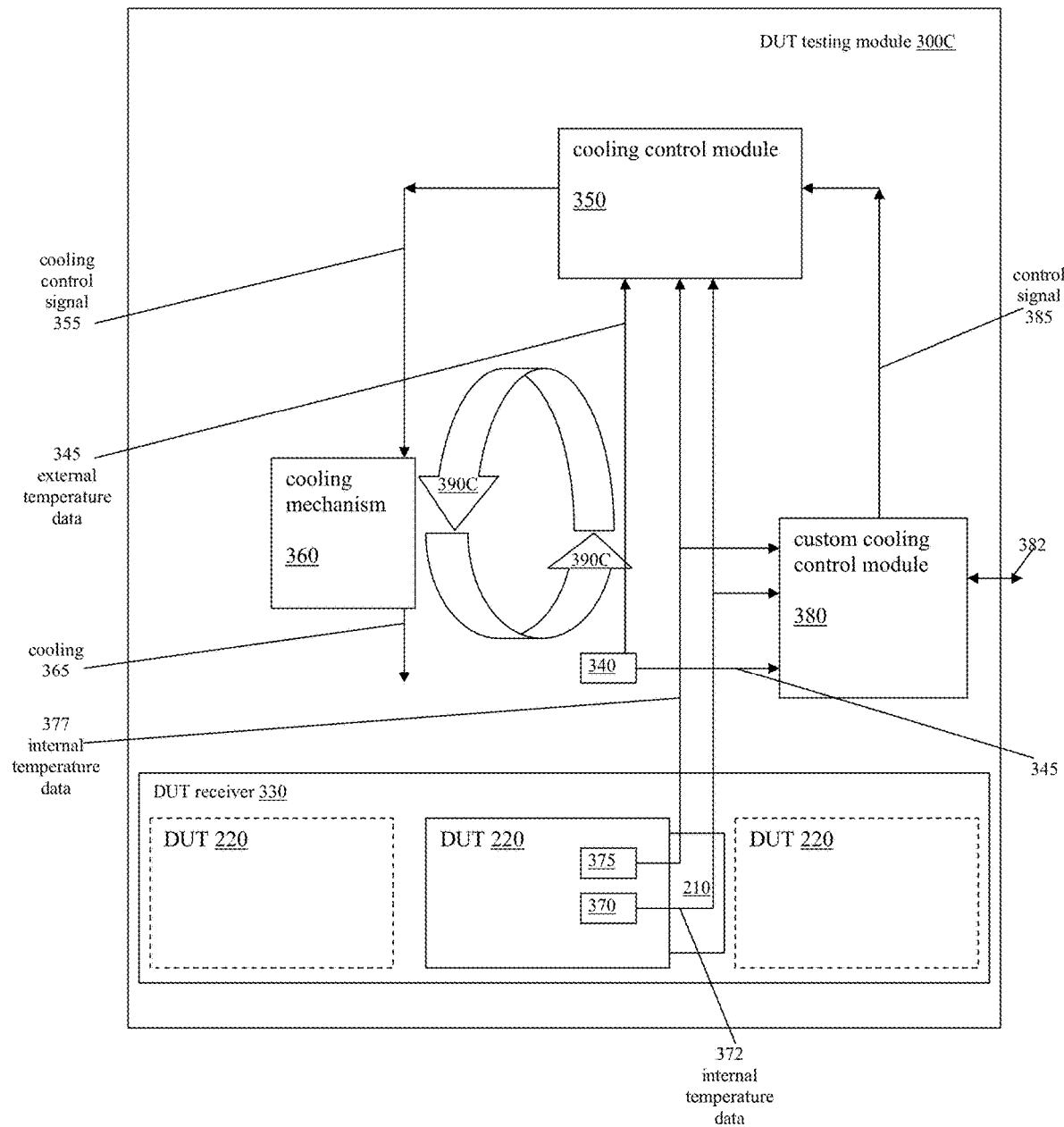
FIG. 5 shows a third cooling control loop in a DUT testing module in accordance with an embodiment.

The following discussion will focus on embodiments of a first cooling control loop in a DUT (device under test) testing module depicted in FIG. 1, a second cooling control loop in a DUT testing module depicted in FIG. 3, and a third cooling control loop in a DUT testing module depicted in FIG. 5. Thereafter, a detailed description of an exemplary DUT testing module that may employ the cooling control loop of FIG. 1, 3, or 5 in accordance with an embodiment will be provided in connection with FIGS. 6 and 7.

FIG. 1 depicts a first cooling control loop 390A in a DUT (device under test) testing module 300A in accordance with an embodiment. It should be understood that the DUT testing module 300A is not limited to the illustration of FIG. 1. The DUT testing module 300A may be modular and may be capable of being inserted into a rack slot of a rack of customizable columns and rows. Continuing, the DUT testing module 300A is operable to perform testing on a DUT 220 or a group of DUTs 220 by communicating power, instructions, signals, data, test results, and/or information with the DUT 220 or DUTs 220. In addition, the DUT testing module 300A may include processing, communication, and storage circuitry to conduct the test on the DUT 220 or DUTs 220. Detailed description of an exemplary DUT testing module is provided in connection with FIGS. 6 and 7.

The DUT testing module 300A includes a DUT receiver 330, an external temperature sensor 340 for each DUT 220 or for a set of DUTs 220, a cooling control module 350, a cooling mechanism 360, and a first cooling control loop 390A. The DUT receiver 330 is operable to receive and to secure each DUT 220 for testing. Each DUT 220 is insertable into the DUT receiver 330 for testing by the DUT testing module 300A and is removable from the DUT receiver 330 after completion of testing. Also, the DUT receiver 330 may have a respective socket or connector 210 for each DUT 220 to electrically and physically interface with the DUT testing module 300A. A plurality of DUTs 220 may be secured to the DUT receiver 330 for concurrent testing of multiple DUTs 220 by the DUT testing module 300A. Alternatively, one DUT 220 may be secured to the DUT receiver 330 for testing of a single DUT 220 by the DUT testing module 300A.

During testing of the DUT 220 by the DUT testing module 300A, the DUT 220 generates heat and emits the heat into the surrounding external environment. To maintain the DUT 220 at a desired operational temperature or desired operational temperature range, the first cooling control loop 390A is operable to dissipate the heat and to cool the DUT 220 during testing of the DUT 220 by the DUT testing module 300A.

In an embodiment, the first cooling control loop 390A includes internal temperature sensors 370 and 375 of the DUT 220 and the external temperature sensor 340, the cooling control module 350, and the cooling mechanism 360 of the DUT testing module 300A. It should be understood that the first cooling control loop 390A is not limited to the illustration of FIG. 1. For simplicity of discussion of the first cooling control loop 390A, details of one DUT 220 (depicted in solid line) are shown in relation to the first cooling control loop 390A in FIG. 1. It should be understood that the illustrated details of DUT 220 (shown in solid line) of FIG. 1 are equally applicable to details not depicted of the other DUTs 220 (shown in broken line) of FIG. 1.

As shown in FIG. 1, the DUT 220 includes internal temperature sensors 370 and 375 that may be provided by and may be positioned at locations specified by a test user, device designer, or device manufacturer. Inside of the DUT 220, the internal temperature sensors 370 and 375 measure internal temperature of the DUT 220 and generate internal temperature data 372 and 377 during testing of the DUT 220 by the DUT testing module 300A. The internal temperature data 372 and 377 discloses the actual thermal conditions experienced by the DUT 220 during testing. Although two internal temperature sensors 370 and 375 are depicted in FIG. 1, the DUT 220 may have a single internal temperature sensor or may have more than two internal temperature sensors. It should be understood that the DUT 220 is not limited to the illustration of FIG. 1.

Continuing, the internal temperature sensors 370 and 375 may be two standard temperature sensors, two custom temperature sensors, or one standard temperature sensor and one custom temperature sensor. The standard temperature sensor may be an "off-the-shelf" temperature sensor or may be a temperature sensor with functionality, e.g., communication capability, in compliance with a published standard protocol, e.g., SMART Data, Simple Sensor Interface, NIST (National Institute of Standards and Technology) protocol, etc. On the other hand, the custom temperature sensor may be a temperature sensor with a custom and proprietary design that may be kept secret or may not be publicly available, even to the provider of the DUT testing module 300A.

Further, the positioning of the internal temperature sensors 370 and 375 inside the DUT 220 may yield a competitive advantage or trade secret which is the subject of efforts to protect and to prevent public dissemination thereof. It is desired to keep secret and to prevent the revealing of advantageous information. Examples of advantageous information include internal locations of the internal temperature sensors 370 and 375 inside the DUT 220, internal heat-generating components whose heat is measured by the internal temperature sensors 370 and 375 based on the internal locations, and type of internal temperature sensor at each internal location. As will be explained in detail below, the first cooling control loop 390A ensures the advantageous information is unrevealed outside of the DUT 220 during testing of the DUT 220 by the DUT testing module 300A.

Continuing with the description of the first cooling control loop 390A, the external temperature sensor 340 associated with the DUT 220 is operable to measure temperature of a surrounding environment external to and adjacent to (or in the vicinity of) the DUT 220 and to generate external temperature data 345 during testing of the DUT 220 by the DUT testing module 300A. Each DUT 220 has a respective external temperature sensor 340 associated with the DUT 220. The surrounding environment is heated by heat generated and emitted by the DUT 220 during testing. The external temperature data 345 from the external temperature sensor 340 represents an approximation of the actual thermal conditions experienced by the DUT 220 and/or of various other parameters, such as DUT power consumption/dissipation, during testing. The correlation between the approximation and the actual thermal conditions of the DUT 220 may vary over time, with type of form factor used, with power utilization, etc.

In an embodiment, the cooling control module 350 is operable to execute a predetermined cooling control algorithm with temperature data to obtain an algorithm result and is operable to generate a cooling control signal 355 based on the algorithm result during testing of the DUT 220 by the DUT testing module 300A. The temperature data is selectable from the internal temperature data 372 and 377 and the external temperature data 345. The predetermined cooling control algorithm may be sufficient to manage and to cool thermal conditions for a range of DUT sizes and DUT types during testing. The predetermined cooling control algorithm may focus on handling or preventing undesirable thermal conditions that are detrimental to testing and to generating reliable testing results irrespective of the actual DUT undergoing testing. Also, the predetermined cooling control algorithm may be a default cooling control algorithm of the DUT testing module 300A. A custom cooling control algorithm may not be available or needed.

As shown in FIG. 1, the cooling control module 350 may receive the internal temperature data 372 and 377 and the external temperature data 345. Although not shown in FIG. 1, there are internal temperature data 372 and 377 and external temperature data 345 associated with each DUT 220 of a group of DUTs 220 concurrently tested by the DUT testing module 300A.

Alternatively, the external temperature data 345 and/or one of the internal temperature data 372 and 377 may be excluded and not received by the cooling control module 350.

The advantageous information noted above is unrevealed outside of the DUT 220 during testing of the DUT 220 by the DUT testing module 300A. Also, the countless number of designs for the internal temperature sensors 370 and 375 is not a barrier to use of the internal temperature data 372 and 377 during testing of the DUT 220 by the DUT testing module 300A. These benefits are accomplished through the process of setting-up the DUT testing module 300A for testing the DUT 220. Setting-up the DUT testing module 300A for testing the DUT 220 involves obtaining or receiving a testing routine that is executed by the DUT testing module 300A to perform the testing of the DUT 220. The testing routine may be provided by a test user, device designer, or device manufacturer. In an embodiment, the testing routine is configured to cause the DUT 220 to output the internal temperature data 372 and 377 during testing.

In response to the testing routine during testing of the DUT 220, the DUT 220 outputs and makes available the internal temperature data 372 and 377 for the predetermined cooling control algorithm executed by the cooling control module 350. This bypasses communication interaction between the internal temperature sensors 370 and 375 and the DUT testing module 300A or components of the DUT testing module 300A, maintaining the desired secrecy and nonpublic aspect of the advantageous information. Since the DUT 220 outputs and makes available the internal temperature data 372 and 377, it is not necessary for the DUT testing module 300A or components of the DUT testing module 300A to recognize the internal temperature sensors 370 and 375, to have the capability to communicate with the communication protocol of the internal temperature sensors 370 and 375, or to know details of the internal locations of the internal temperature sensors 370 and 375 inside the DUT 220.

Continuing, the cooling control module 350 may execute the predetermined cooling control algorithm with temperature data selectable from the internal temperature data 372 and 377 and the external temperature data 345. For example, the cooling control module 350 may execute the predetermined cooling control algorithm with the internal temperature data 372 and 377 and the external temperature data 345 to obtain the algorithm result to generate the cooling control signal 355. Alternatively, the cooling control module 350 may execute the predetermined cooling control algorithm with the internal temperature data 372 and 377 but not the external temperature data 345 to obtain the algorithm result to generate the cooling control signal 355. In yet another alternative, the cooling control module 350 may execute the predetermined cooling control algorithm with one of the internal temperature data 372 and 377 but not the external temperature data 345 and not one of the internal temperature data 372 and 377 to obtain the algorithm result to generate the cooling control signal 355.

Before using the internal temperature data 372 and 377 and the external temperature data 345 associated with an individual DUT 220 in the predetermined cooling control algorithm, the cooling control module 350 may determine whether the individual DUT 220 is undergoing testing due to the DUT testing module 300A performing the testing routine on the individual DUT 220. If the status of the testing of the individual DUT 220 is stopped, suspended, or interrupted, the cooling control module 350 may avoid using the internal temperature data 372 and 377 and the external temperature data 345 associated with the individual DUT 220 in the predetermined cooling control algorithm.

Although the cooling control module 350 may deal with the temperature data associated with each individual DUT 220 of a group of DUTs 220 concurrently tested by the DUT testing module 300A, the predetermined cooling control algorithm may implement cooling decisions on the basis of the thermal condition of the group of DUTs 220 instead of the thermal condition of an individual DUT 220.

Returning to the description of the first cooling control loop 390A, the cooling mechanism 360 is coupled to the cooling control module 350. Also, the cooling mechanism 360 is operable to cool the group of DUTs 220 based on the cooling control signal 355 during testing of the group of DUTs 220 by the DUT testing module 300A. Alternatively, the cooling mechanism 360 is operable to cool a single DUT 220 based on the cooling control signal 355 during testing of the single DUT 220 by the DUT testing module 300A. The cooling mechanism 360 effectuates cooling 365 to an extent corresponding to the cooling control signal 355 during testing of the group of DUTs 220 or testing of the single DUT 220. Due to the cooling control signal 355, the cooling mechanism 360 may experience time intervals of increased activity to boost cooling 365, time intervals of decreased activity to lessen cooling 365, and time intervals of steady activity to sustain cooling 365 at a particular level. Examples of the cooling mechanism 360 include, but not limited to, a fan, a blower, a chiller, and a liquid cooling system. In the case of the cooling mechanism 360 implemented as a fan, the cooling control signal 355 may correspond to an rpm (revolutions per minute) value at which the fan is to operate.

As discussed above, there is much flexibility with the first cooling control loop 390A. Moreover, multiple cooling control modules 350 may be incorporated into the first cooling control loop 390A to generate cooling control signals 355 for multiple cooling mechanisms 360 or for subcomponents of the cooling mechanism 360.

Numerous benefits are achieved. Various customizations are available and may be implemented as desired. There are improvements in cooling control. Better representation of actual thermal conditions experienced by the DUT 220 and/or of various other parameters, such as DUT power consumption/dissipation, during testing is achieved by using internal temperature data from one or more internal temperature sensors of the DUT 220. This enables faster and more accurate response by the new cooling control. The response is faster because the new cooling control avoids the delay caused by the time interval required for heat to propagate from the DUT 220 to an external location where an external temperature sensor may be able to measure temperature fluctuations due to the DUT 220. Also, the response is more accurate because the internal temperature data of the DUT 220 discloses the actual thermal conditions that need to be managed or cooled while external temperature data from the external temperature sensor discloses an approximation whose correlation with the actual thermal conditions of the DUT 220 may vary over time, with type of form factor used, with power utilization, etc. Further, advantageous information related to the internal temperature sensor of the DUT 220 is unrevealed outside of the DUT 220 during testing.

Figure 2:
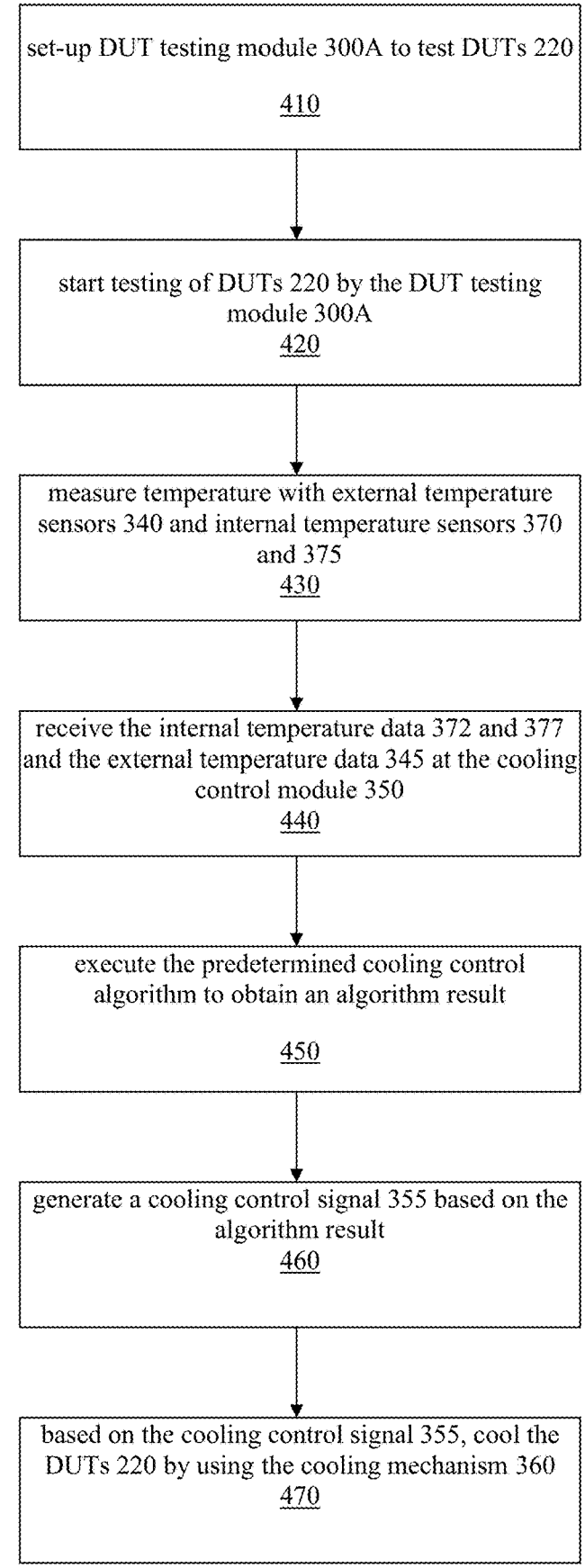
FIG. 2 shows a flow diagram of operation of the first cooling control loop of FIG. 1 in accordance with an embodiment.

FIG. 2 shows a flow diagram 400 of operation of the first cooling control loop 390A of FIG. 1 in accordance with an embodiment. It should be understood that operation of the first cooling control loop 390A is not limited to the illustration of FIG. 2.

At Block 410, the DUT testing module 300A is set-up for testing a group of DUTs 220. It is also possible to test a single DUT 220. Setting-up the DUT testing module 300A for testing the DUTs 220 involves obtaining or receiving a testing routine that is executed by the DUT testing module 300A to perform the testing of the DUTs 220. The testing routine may be provided by a test user, device designer, or device manufacturer. In an embodiment, the testing routine is configured to cause the DUTs 220 to output the internal temperature data 372 and 377 during testing. In response to the testing routine during testing of the DUTs 220, the DUTs 220 output and make available the internal temperature data 372 and 377 for the predetermined cooling control algorithm executed by the cooling control module 350. Also, selection of desired temperature data from the internal temperature data 372 and 377 and the external temperature data 345 is made for the DUT testing module 300A and its components (e.g., the cooling control module 350) to use during testing.

Continuing, the testing of the DUTs 220 is started by the DUT testing module 300A, at Block 420. As testing proceeds at Block 430, the external temperature sensors 340 measure and generate the external temperature data 345, as explained above. Additionally, the internal temperature sensors 370 and 375 measure and generate the internal temperature data 372 and 377, as discussed above.

At Block 440, the cooling control module 350 receives the internal temperature data 372 and 377 and the external temperature data 345. As discussed above, the temperature data received by the cooling control module 350 may be customized. At Block 450, the cooling control module 350 executes the predetermined cooling control algorithm with the internal temperature data 372 and 377 and the external temperature data 345 to obtain an algorithm result. As discussed above, the temperature data utilized by the cooling control module 350 to execute the predetermined cooling control algorithm may be customized. The cooling control module 350 generates a cooling control signal 355 based on the algorithm result during testing, at Block 460.

Further, the cooling mechanism 360 cools the DUTs 220 based on the cooling control signal 355, at Block 470. The cooling mechanism 360 effectuates cooling 365 to an extent corresponding to the cooling control signal 355, as discussed above.

FIG. 3 illustrates a second cooling control loop 390B in a DUT testing module 300B in accordance with an embodiment. It should be understood that the second cooling control loop 390B and the DUT testing module 300B are not limited to the illustration of FIG. 3. Except as discussed below, the description of the first cooling control loop 390A and the DUT testing module 300A of FIG. 1 is applicable to the second cooling control loop 390B and the DUT testing module 300B of FIG. 3.

As depicted in FIG. 3, the DUT testing module 300B includes a DUT receiver 330, an external temperature sensor 340 for each DUT 220, a cooling control module 350, a custom cooling control module 380, and a second cooling control loop 390B. In an embodiment, the second cooling control loop 390B includes internal temperature sensors 370 and 375 of the DUT 220 and the external temperature sensor 340, the cooling control module 350, the custom cooling control module 380, and the cooling mechanism 360 of the DUT testing module 300B. For simplicity of discussion of the second cooling control loop 390B, details of one DUT 220 (depicted in solid line) are shown in relation to the second cooling control loop 390B in FIG. 3. It should be understood that the illustrated details of DUT 220 (shown in solid line) of FIG. 3 are equally applicable to details not depicted of the other DUTs 220 (shown in broken line) of FIG. 3. Further, although the cooling control module 350 and the custom cooling control module 380 are separately shown in FIG. 3, it should be understood that the cooling control module 350 and the custom cooling control module 380 may be combined and/or integrated.

While the cooling control module 350 is operable to execute a predetermined cooling control algorithm (e.g., default cooling control algorithm), the custom cooling control module 380 is operable to execute a custom cooling control algorithm to obtain an algorithm result and is operable to generate a control signal 385 based on the algorithm result during testing of the DUT 220 by the DUT testing module 300B. A test user, device designer, or device manufacturer may provide the custom cooling control algorithm. The custom cooling control module 380 may utilize the internal temperature data 372 and 377, the external temperature data 340, or any combination thereof to obtain the algorithm result. It should be understood that the custom cooling control algorithm may be unrelated to the predetermined cooling control algorithm or may be a modified version of or modifications to the predetermined cooling control algorithm.

The custom cooling control algorithm addresses the thermal conditions of DUT(s) of specific size(s) and/or type(s) to improve the progress of testing and to reduce negative thermal influences on the DUT(s) of specific size(s) and/or type(s) during testing, leading to better and faster testing results. With the custom cooling control algorithm, damage due to thermal conditions to the DUT is avoided during testing because cooling may be managed to prevent occurrence of specific thermal conditions that lead to damage or failure of the DUT or a component of the DUT. Since there is a relationship between performance and temperature, the custom cooling control algorithm may manage the cooling of the DUT to keep the thermal conditions to which the DUT or a component of the DUT is subjected below a specific threshold. Consequently, testing of the DUT may progress at a higher rate than it is possible when the specific threshold is exceeded during testing. Also, the custom cooling control algorithm may deal with or avert temperature rise ramps that are steep or that lead to unreliable testing results, leading to desired temperature rise ramps and better testing results. The custom cooling control algorithm may be proprietary, confidential, and/or secret. Also, the custom cooling control algorithm may be configured with attributes, properties, and/or characteristics of a DUT(s) of specific size(s) and/or type(s) to ensure the thermal conditions the DUT is exposed to are not harmful to and are suitable for the attributes, properties, and/or characteristics of the DUT. That is, the custom cooling control algorithm is dependent on the DUT.

The custom cooling control module 380 is integrated into the DUT testing module 300B in an automated and seamless manner. In an embodiment, the custom cooling control module 380 comprises a plug-in. Alternatively, the custom cooling control module 380 comprises an extensible component.

As shown in FIG. 3, the custom cooling control module 380 is configurable via input 382. The custom cooling control algorithm, code, files, data, etc. may be provided via input 382. In an embodiment, the custom cooling control module 380 is compliant with an API (application programming interface) made available by the DUT testing module 300B. By satisfying the API, the custom cooling control module 380 may be automatically integrated while setting-up the DUT testing module 300B for testing the DUT 220. Consequently, the DUT testing module 300B may utilize the custom cooling control module 380 and the custom cooling control algorithm for managing the cooling of the DUT 220 instead of using the cooling control module 350 and the predetermined cooling control algorithm (e.g., the default cooling control algorithm) for managing the cooling of the DUT 220. In an embodiment, it may be sufficient for the test user, device designer, or device manufacturer to supply the custom cooling algorithm, code, data, and/or files (e.g., configuration file(s)) that the DUT testing module 300B accesses during a set-up process to automatically accept the internal temperature data 372 and 377 from the internal temperature sensors 370 and 375 and use the custom cooling algorithm in lieu of the predetermined cooling control algorithm (e.g., the default cooling control algorithm).

As shown in FIG. 3, the custom cooling control module 380 may receive the internal temperature data 372 and 377 and the external temperature data 345. Although not shown in FIG. 3, there are internal temperature data 372 and 377 and external temperature data 345 associated with each DUT 220 of a group of DUTs 220 concurrently tested by the DUT testing module 300B.

Alternatively, the external temperature data 345 and/or one of the internal temperature data 372 and 377 may be excluded and not received by the custom cooling control module 380.

The advantageous information noted above is unrevealed outside of the DUT 220 during testing of the DUT 220 by the DUT testing module 300B. Setting-up the DUT testing module 300B for testing the DUT 220 may also involve obtaining or receiving a testing routine that is executed by the DUT testing module 300B to perform the testing of the DUT 220. The testing routine may be provided by a test user, device designer, or device manufacturer. In an embodiment, the testing routine is configured to cause the DUT 220 to output the internal temperature data 372 and 377 during testing. In response to the testing routine during testing of the DUT 220, the DUT 220 outputs and makes available the internal temperature data 372 and 377 for the custom cooling control algorithm executed by the custom cooling control module 380.

Continuing, the custom cooling control module 380 may execute the custom cooling control algorithm with temperature data selectable from the internal temperature data 372 and 377 and the external temperature data 345. For example, the custom cooling control module 380 may execute the custom cooling control algorithm with the internal temperature data 372 and 377 and the external temperature data 345 to obtain the algorithm result to generate the control signal 385. The cooling control module 350 receives the control signal 385 and passes the control signal 385 as the cooling control signal 355 to the cooling mechanism 360. In an embodiment, the control signal 385 is unaltered through the cooling control module 350 to pass as the cooling control signal 355 to the cooling mechanism 360. Alternatively, the cooling control module 350 executes an operation(s) with the control signal 385 to generate the cooling control signal 355.

Alternatively, the custom cooling control module 380 may execute the custom cooling control algorithm with the internal temperature data 372 and 377 but not the external temperature data 345 to obtain the algorithm result to generate the control signal 385. In yet another alternative, the custom cooling control module 380 may execute the custom cooling control algorithm with one of the internal temperature data 372 and 377 but not the external temperature data 345 and not one of the internal temperature data 372 and 377 to obtain the algorithm result to generate the control signal 385.

Returning to the description of the second cooling control loop 390B, the cooling control module 350 receives the control signal 385 and passes the control signal 385 as the cooling control signal 355 to the cooling mechanism 360. The cooling mechanism 360 is operable to cool the group of DUTs 220 or the single DUT 220 based on the cooling control signal 355 during testing of the group of DUTs 220 or testing of the single DUT 220 by the DUT testing module 300B. The cooling mechanism 360 effectuates cooling 365 to an extent corresponding to the cooling control signal 355 during testing of the group of DUTs 220 or testing of the single DUT 220. Due to the cooling control signal 355, the cooling mechanism 360 may experience time intervals of increased activity to boost cooling 365, time intervals of decreased activity to lessen cooling 365, and time intervals of steady activity to sustain cooling 365 at a particular level. Examples of the cooling mechanism 360 include, but not limited to, a fan, a blower, a chiller, and a liquid cooling system. In the case of the cooling mechanism 360 implemented as a fan, the cooling control signal 355 may correspond to an rpm (revolutions per minute) value at which the fan is to operate.

As discussed above, there is much flexibility with the second cooling control loop 390B. Moreover, multiple custom cooling control modules 380 may be incorporated into the second cooling control loop 390B to generate control signals 385 for multiple cooling mechanisms 360 or for sub-components of the cooling mechanism 360.

Flexibility with respect to the cooling control algorithm employed for the DUT during testing permits utilization of a custom cooling control algorithm instead of a predetermined cooling control algorithm. The predetermined cooling control algorithm may be sufficient to manage and to cool thermal conditions for a range of DUT sizes and DUT types during testing. Unlike the predetermined cooling control algorithm, the custom cooling control algorithm addresses the thermal conditions of DUT(s) of specific size(s) and/or type(s) to improve the progress of testing and to reduce negative thermal influences on the DUT(s) of specific size(s) and/or type(s) during testing, leading to better and faster testing results. The custom cooling control algorithm is integrated into the DUT testing module 300B in an automated and seamless manner.

Figure 4:
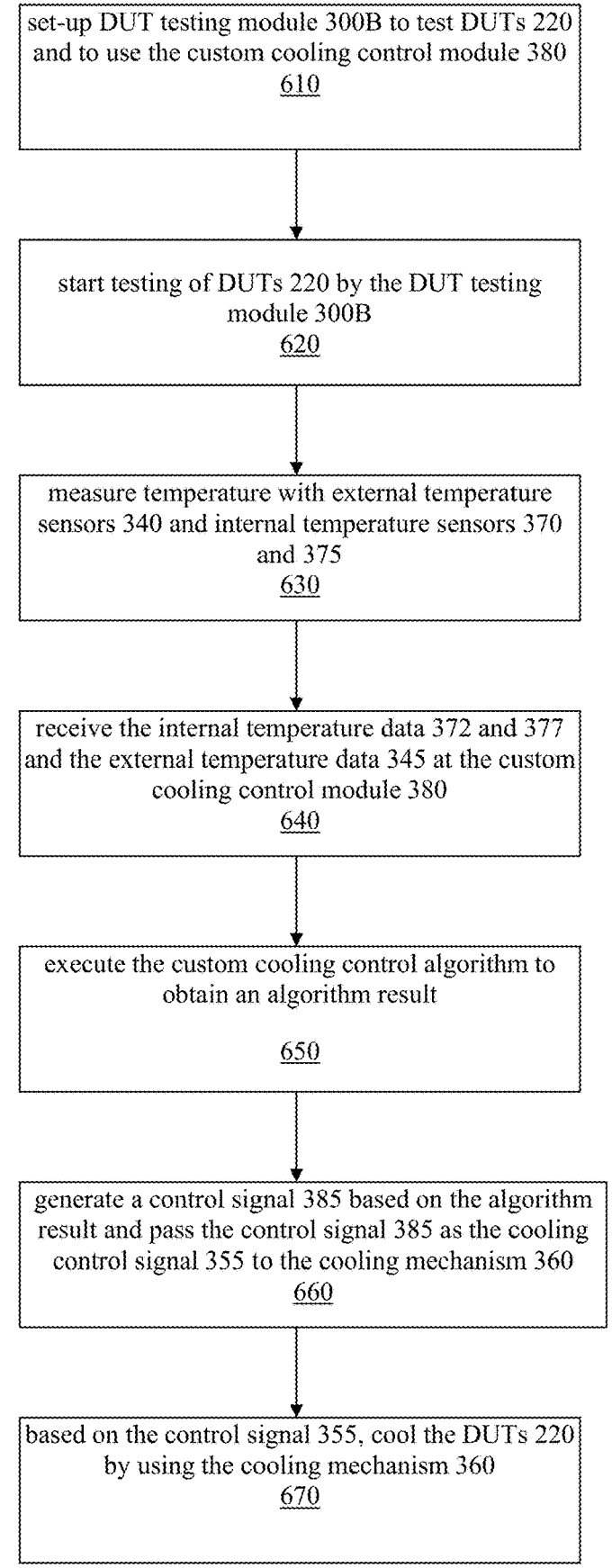
FIG. 4 depicts a flow diagram of operation of the second cooling control loop of FIG. 3 in accordance with an embodiment.

FIG. 4 depicts a flow diagram 600 of operation of the second cooling control loop 390B of FIG. 3 in accordance with an embodiment. It should be understood that operation of the second cooling control loop 390B is not limited to the illustration of FIG. 4.

At Block 610, the DUT testing module 300B is set-up for testing a group of DUTs 220. It is also possible to test a single DUT 220. Setting-up the DUT testing module 300B for testing the DUTs 220 involves automatically integrating the custom cooling control module 380 for use by the DUT testing module 300B for testing the DUTs 220. Consequently, the DUT testing module 300B may utilize the custom cooling control module 380 and the custom cooling control algorithm for managing the cooling of the DUTs 220 instead of using the cooling control module 350 and the predetermined cooling control algorithm (e.g., default cooling control algorithm) for managing the cooling of the DUTs 220. Also, selection of desired temperature data from the internal temperature data 372 and 377 and the external temperature data 345 is made for the DUT testing module 300B and its components to use during testing.

Continuing, the testing of the DUTs 220 is started by the DUT testing module 300B, at Block 620. During testing at Block 630, the external temperature sensors 340 measure and generate the external temperature data 345, as explained above. Additionally, the internal temperature sensors 370 and 375 measure and generate the internal temperature data 372 and 377, as discussed above.

At Block 640, the custom cooling control module 380 receives the internal temperature data 372 and 377 and the external temperature data 345. As discussed above, the temperature data received by the custom cooling control module 380 may be customized. At Block 650, the custom cooling control module 380 executes the custom cooling control algorithm with the internal temperature data 372 and 377 and the external temperature data 345 to obtain an algorithm result. As discussed above, the temperature data utilized by the custom cooling control module 380 to execute the custom cooling control algorithm may be customized. The custom cooling control module 380 generates a control signal 385 based on the algorithm result during testing, at Block 660. The cooling control module 350 receives the control signal 385 and passes the control signal 385 as the cooling control signal 355 to the cooling mechanism 360. Alternatively, the cooling control module 350 executes an operation(s) with the control signal 385 to generate the cooling control signal 355.

Further, the cooling mechanism 360 cools the DUTs 220 based on the cooling control signal 355, at Block 670. The cooling mechanism 360 effectuates cooling 365 to an extent corresponding to the cooling control signal 355, as described above.

FIG. 5 shows a third cooling control loop 390C in a DUT testing module 300C in accordance with an embodiment. It should be understood that the third cooling control loop 390C and the DUT testing module 300C are not limited to the illustration of FIG. 5. Except as discussed below, the description of FIGS. 1 and 3 is applicable to the third cooling control loop 390C and the DUT testing module 300C of FIG. 5.

As depicted in FIG. 5, the DUT testing module 300C includes a DUT receiver 330, an external temperature sensor 340 for each DUT 220, a cooling control module 350, a custom cooling control module 380, and a third cooling control loop 390C. For simplicity of discussion of the third cooling control loop 390C, details of one DUT 220 (depicted in solid line) are shown in relation to the third cooling control loop 390C in FIG. 5. It should be understood that the illustrated details of DUT 220 (shown in solid line) of FIG. 5 are equally applicable to details not depicted of the other DUTs 220 (shown in broken line) of FIG. 5. Further, although the cooling control module 350 and the custom cooling control module 380 are separately shown in FIG. 5, it should be understood that the cooling control module 350 and the custom cooling control module 380 may be combined and/or integrated.

In an embodiment, the third cooling control loop 390C and the DUT testing module 300C offer flexibility with respect to the cooling control algorithm employed for the DUT 220 during testing. The third cooling control loop 390C and the DUT testing module 300C permit utilization of the cooling control module 350 and the predetermined cooling control algorithm when desired or utilization of the custom cooling control module 380 and the custom cooling control algorithm when desired. Setting-up the DUT testing module 300C for testing the DUT 220 involves setting the cooling control algorithm to be implemented by the custom cooling control module 380 and the custom cooling control algorithm or setting the cooling control algorithm to be implemented by the cooling control module 350 and the predetermined cooling control algorithm. As discussed above, the custom cooling control module 380 may be automatically integrated while setting-up the DUT testing module 300C for testing the DUT 220. Also, configuration of the cooling control module 350 may occur while setting-up the DUT testing module 300C for testing the DUT 220. It should be understood that the custom cooling control algorithm may be unrelated to the predetermined cooling control algorithm or may be a modified version of or modifications to the predetermined cooling control algorithm.

Figure 6:
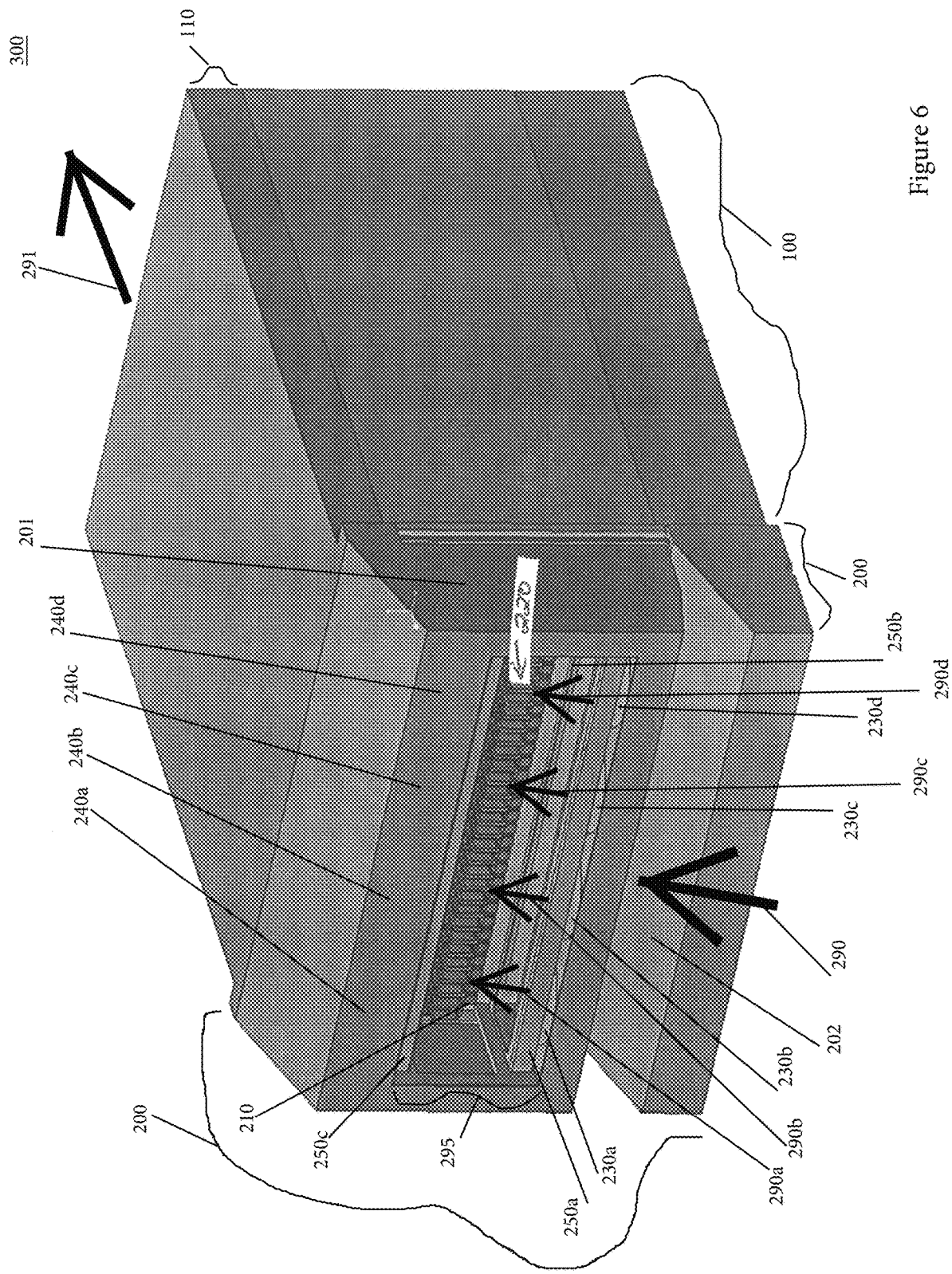
FIG. 6 depicts a perspective view of an exemplary DUT (device under test) testing module that may employ the cooling control loop of FIG. 1, 3, or 5 in accordance with an embodiment.

FIG. 6 depicts a perspective view of an exemplary DUT (device under test) testing module that may employ the cooling control loop of FIG. 1, 3, or 5 in accordance with an embodiment. It should be understood that the exemplary DUT testing module 300 is not limited to the illustration of FIG. 6. The exemplary DUT testing module 300 is modularized and is capable of being inserted into a rack supporting a plurality of modules with communication and power signals carried from the back of the exemplary DUT testing module 300 to one or more central control computers or testing stations (not shown).

The exemplary DUT testing module 300 includes a DIB (DUT interface board) 200 and a test execution module (or primitive) 100 electrically coupled to the DIB 200. Further, the exemplary DUT testing module 300 is modular and has testing logic for testing the DUTs in the DIB 200. In this capacity, the testing logic supplies high speed communication and power. As described above, the primitive is modular, that is, individual exemplary DUT testing modules 300 may be inserted into respective rack slots to create a rack of customizable columns and rows in an ambient air environment (e.g., a testing floor or lab), eliminating the need for an environmental testing chamber.

Figure 7:
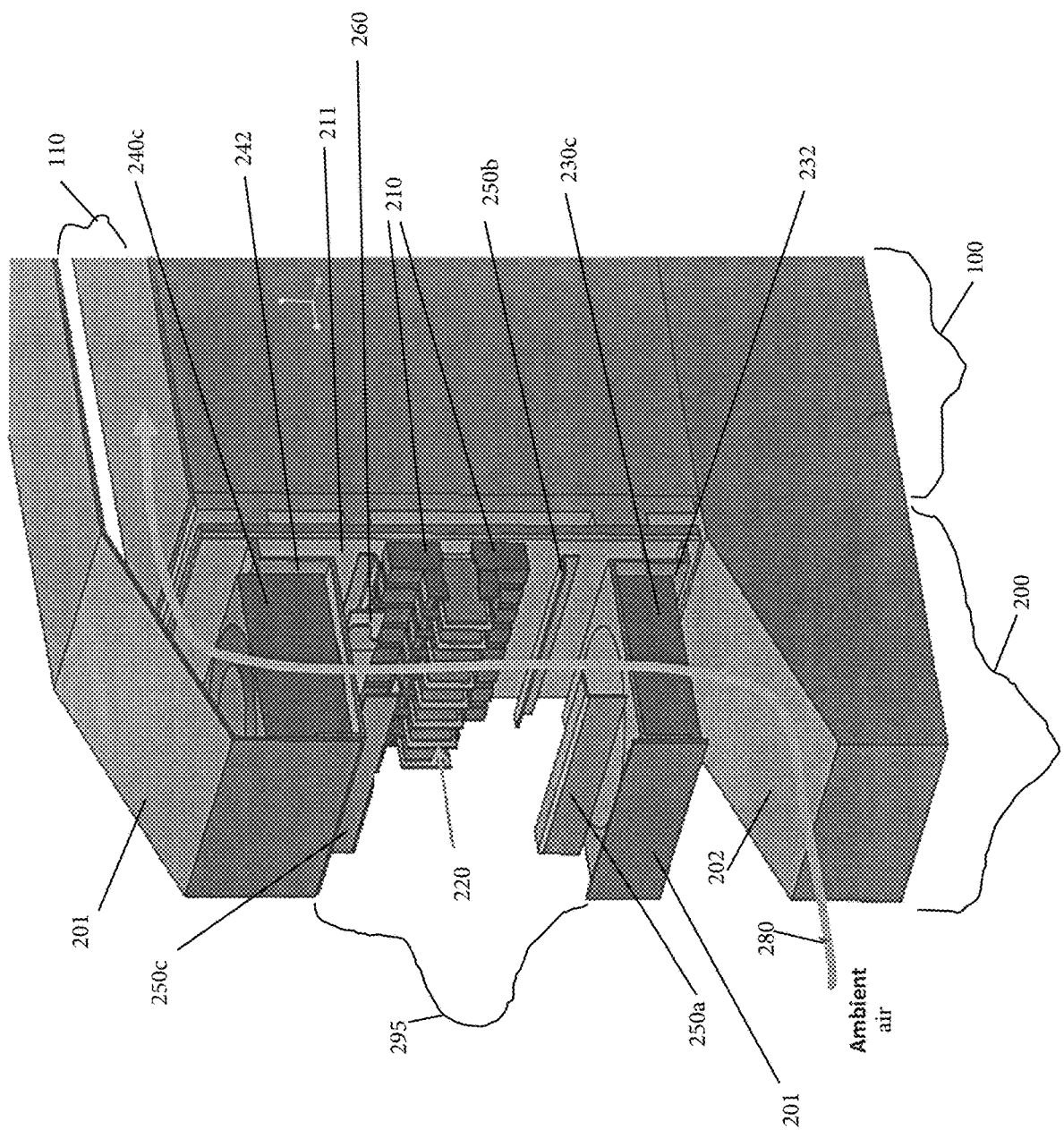
FIG. 7 shows a cutaway view of the exemplary DUT testing module of FIG. 6 in accordance with an embodiment.

The test execution module 100 is operable to perform the testing on a DUT 220 or DUTs 220 by communicating power, instructions, signals, data, test results, and/or information with the DUT 220 or DUTs 220. The test execution module 100 includes processing, communication, and storage circuitry to conduct the test on the DUTs 220. Further, the first cooling control loop 390A (FIG. 1), the second cooling control loop 390B (FIG. 3), or the third cooling control loop 390C (FIG. 5) may be implemented with the test execution module 100 and the DIB 200 to control the cooling of the DUTs 220 by receiving input signals from external temperature sensors in the vicinity of the DUTs 220 and/or input signals from internal temperature sensors inside the DUTs 220 and by adjusting the rotational speeds of the appropriate bottom fan 230a-230d and top fan 240a-240d (FIG. 6 and FIG. 7). Also, the test execution module 100 includes an air conduit 110 to release air flow 291 from the DIB 200 into the surrounding environment.

Continuing with FIG. 6, the DIB 200 is disposed in front of and is electrically coupled to the test execution module 100. The DIB 200 may operate as a DUT receiver 330 to receive and secure the DUTs 220 for testing. The DIB 200 contains a partial enclosure, in that vents on the bottom and top allow air movement therein. Moreover, the DIB 200 includes a cover 201 (or housing), a slanted part 202, a slot 295, a plurality of sockets 210 to receive and secure the DUTs 220 via the slot 295, and a loadboard 211 (FIG. 7) on which the sockets 210 are securely attached. The sockets 210 are arranged into a row and physically and electrically connect to the DUTs. Also, the loadboard 211 (FIG. 7) electrically and physically interfaces with the test execution module 100 to support communication of power, instructions, signals, data, test results, and/or information between the DUT 220 and the test execution module 100. The load board, on one side that mates with the testing logic 100 has a universal connection layout that matches the testing logic 100 connection layout. On the other side, the load board comprises sockets 210 that are specific (physically and electrically) to a type of DUT being tested. The DIB 200 addresses the problems caused by the availability of numerous form factors and standards, such as M.2, U.2, SATA 2.5", etc. Instead of the test execution module 100 being designed to accommodate a specific form factor and/or standard, in this fashion multiple DIBs 200 are designed for each one of the various form factors and/or standards and are removable/replaceable from the test execution module 100.

Further, dual-fan cooling with ambient air is integrated into the DIB 200. The dual-fan cooling with ambient air includes bottom fans 230a-230d inside of the cover 201 of the DIB 200 and top fans 240a-240d inside of and obscured by the cover 201 of the DIB 200. The bottom fan 230c and the top fan 240c are visible in FIG. 7. In an embodiment, each bottom fan 230a-230d is vertically aligned with a respective top fan 240a-240d. Support structure 232 (FIG. 7) securely attaches bottom fans 230a-230d to the DIB 200. Similarly, support structure 242 (FIG. 7) securely attaches top fans 230a-230d to the DIB 200. The rotational speed of the bottom fans and the top fans may be separately adjustable.

Continuing, the DIB 200 includes air guides 250a-250c (FIGS. 6 and 7) and a temperature sensor strip 260 (FIG. 7) with a plurality of external temperature sensors.

Referring again to the dual-fan cooling with ambient air of the DIB 200, The bottom fans 230a-230d are operable to draw ambient air 290 from the surrounding environment via a gap between the slanted part 202 (FIGS. 6 and 7) and the bottom fans 230a-230d.

The top fan 240a and the bottom fan 230a are operable to generate a vertical ambient air flow 290a from the bottom fan 230a to the top fan 240a to cool the plurality of DUTs 220 within the length and width dimensions of the top and bottom fans 240a and 230a. Also, the top fan 240b and the bottom fan 230b are operable to generate a vertical ambient air flow 290b from the bottom fan 230b to the top fan 240b to cool the plurality of DUTs 220 within the length and width dimensions of the top and bottom fans 240b and 230b. In addition, the top fan 240c and the bottom fan 230c are operable to generate a vertical ambient air flow 290c from the bottom fan 230c to the top fan 240c to cool the plurality of DUTs 220 within the length and width dimensions of the top and bottom fans 240c and 230c. Further, the top fan 240d and the bottom fan 230d are operable to generate a vertical ambient air flow 290d from the bottom fan 230d to the top fan 240d to cool the plurality of DUTs 220 within the length and width dimensions of the top and bottom fans 240d and 230d.

The air guides 250a-250c (FIGS. 6 and 7) are operable to control a direction of the vertical ambient air flow. The air guides 250a-250c (FIGS. 6 and 7) reduce ambient air loss through the slot 295 and assist in directing the vertical ambient air flow towards the top fans 240a-240d.

From the top fans 240a-240d, the air conduit 110 (FIGS. 6 and 7) adjacent to the top fans 240a-240d receives and releases the vertical ambient air flows 291 into the surrounding environment.

In an embodiment, the plurality of DUTs 220 have exposed top and bottom sides and can be arranged on a 13.3 mm pitch in one example. The vertical ambient air flows 290a-290d dissipate heat from the exposed top and bottom sides to cool the plurality of DUTs 220. The exposed top and bottom sides of the plurality of DUTs 220 are vertically aligned with a direction of the vertical ambient air flows 290a-290d to increase the cooling effect of the vertical ambient air flows 290a-290d on the plurality of DUTs 220.

FIG. 7 shows a cutaway view of the exemplary DUT testing module of FIG. 6 in accordance with an embodiment. One fan unit slice (top fan 240c and bottom fan 230c) is depicted in FIG. 7. The other three fan unit slices (top fan 240a and bottom fan 230a, top fan 240b and bottom fan 230b, and top fan 240d and bottom fan 230d) are similar in operation to the fan unit slice (top fan 240c and bottom fan 230c) shown in FIG. 7. It should be understood that the fan unit slice (top fan 240c and bottom fan 230c) of the exemplary DUT testing module 300 is not limited to the illustration of FIG. 7.

The path 280 of ambient air through the bottom fan 230c and top fan 240c of the exemplary DUT testing 300 (FIG. 6) is illustrated. Initially, the bottom fan 230c draws ambient air from the surrounding environment via the gap between the slanted part 202 and the bottom fan 230c. Then, the bottom fan 230c directs the ambient air upward to the top fan 240c while concurrently the top fan 240c also directs the ambient air upwards. Thereafter, the ambient air is released via the air conduit 110 into the surrounding environment.

The vertical ambient air flow 290c (FIG. 6) from the bottom fan 230c and the top fan 240c benefits by the existence of a lower air pressure adjacent to the bottom of the top fan 240c relative to the air pressure down towards the bottom fan 230c. Air naturally flows from areas of higher air pressure to areas of lower air pressure.

In an embodiment, the lower air pressure adjacent to the bottom of the top fan 240c is achieved by operating the top fan 240c at a rotational speed that is greater than a rotational speed of the bottom fan 230c in generating the vertical ambient air flow 290c. This improves the cooling effectiveness of the vertical ambient air flow 290c and helps to prevent the escape of air from the vertical ambient air flow 290c through the slot 295 in the DIB 200 and outward into a face of an operator monitoring a robotic handler for insertion and/or removal of DUTs 220 or manually handling the insertion and/or removal of DUTs 220 from the DIB 200 via the slot 295. In an embodiment, the fan selected to be the top fan 240c has a maximum rotational speed greater than the maximum rotational speed of the fan selected to be the bottom fan 230c. Exemplary values for the maximum rotational speeds are 75 rps (revolutions per second) for the top fan 240c and 60 rps for the bottom fan 230c.

The volume and speed of the vertical ambient air flow 290c due to the top fan 240c and bottom fan 230c are factors in determining the range of temperatures in which the vertical ambient air flow 290c is sufficient to cool the DUTs 220 during testing. The rotational speeds of the top fan 240c and bottom fan 230c may be adjusted in accordance with the amount of cooling that is needed until a set point or desired temperature is reached with respect to the DUTs 220 during testing.

As depicted in FIG. 7, the sizes of top fan 240c and bottom fan 230c are sufficient for the vertical ambient air flow 290c (FIG. 6) to extend across eight DUTs 220 for providing the cooling effect. Exemplary values for the sizes are 92 mm×38 mm for the top fan 240c and 92 mm×25.4 mm for the bottom fan 230c, however, any suitable size can be employed. It is also possible to reduce the number of DUTs 220 to expand the range of temperatures in which the vertical ambient air flow 290c is sufficient to cool the DUTs 220 during testing.

The foregoing descriptions of specific embodiments have been presented for purposes of illustration and description. They are not intended to be exhaustive or to limit the disclosure to the precise forms disclosed, and many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the Claims appended hereto and their equivalents.

What is claimed is:

1. A testing apparatus, comprising:
a DUT (device under test) receiver operable to receive and secure at least one DUT, wherein the at least one DUT comprises at least one internal temperature sensor integrated with electronics of the DUT and operable to generate internal temperature data;
a cooling control module operable to selectively execute between a predetermined cooling control algorithm and a custom cooling control algorithm with temperature data to obtain an algorithm result and operable to generate a cooling control signal based on the algorithm result during testing of the at least one DUT, wherein the temperature data is selectable from the internal temperature data and external temperature data of a surrounding environment external to and adjacent to the at least one DUT, and wherein the internal temperature sensor is used by the custom cooling algorithm and unrevealed outside of the at least one DUT; and a cooling mechanism coupled to the cooling control module and operable to cool the at least one DUT based on the cooling control signal.

2. The testing apparatus of claim 1, further comprising an external temperature sensor operable to generate the external temperature data.

3. The testing apparatus of claim 2, wherein the cooling control internal temperature data and the external temperature data to obtain the algorithm result.

4. The testing apparatus of claim 1, wherein the at least one internal temperature sensor comprises one of a standard temperature sensor or a custom temperature sensor, and wherein the cooling mechanism comprises at least one fan.

5. The testing apparatus of claim 1, wherein the at least one DUT is operable to output and to make available the internal temperature data for the predetermined cooling control algorithm in response to a testing routine during testing of the at least one DUT.

6. The testing apparatus of claim 1, wherein a location and a sensor type of the at least one internal temperature sensor within the at least one DUT are unrevealed outside of the at least one DUT during testing of the at least one DUT.

7. A testing apparatus, comprising:
a DUT (device under test) receiver operable to receive and secure at least one DUT wherein the at least one DUT comprises at least one internal temperature sensor integrated with electronics of the DUT and operable to generate internal temperature data;
a custom cooling control module operable to selectively execute between a custom cooling control algorithm dependent on the least one DUT with the internal temperature data from the at least one DUT and a predetermined cooling algorithm to obtain an algorithm result and operable to generate a cooling control signal based on the algorithm result during testing of the at least one DUT, wherein the at least one internal temperature sensor is used by the custom cooling algorithm and unrevealed outside of the at least one DUT; and
a cooling mechanism operable to cool the at least one DUT based on the cooling control signal from execution of the custom cooling control algorithm.

8. The testing apparatus of claim 7, further comprising a cooling control module operable to execute the predetermined cooling control algorithm, wherein the cooling mechanism comprises at least one fan.

9. The testing apparatus of claim 7, wherein the custom cooling control module comprises one of a plug-in or an extensible component.

10. The testing apparatus of claim 7, further comprising an external temperature sensor operable to generate external temperature data of a surrounding environment external to and adjacent to the at least one DUT.

11. The testing apparatus of claim 10, wherein the custom cooling control module is operable to execute the custom cooling control algorithm with the internal temperature data and the external temperature data to obtain the algorithm result.

12. The testing apparatus of claim 7, wherein the at least one internal temperature sensor comprises one of a standard temperature sensor or a custom temperature sensor.

13. The testing apparatus of claim 7, wherein the at least one DUT is operable to output and to make available the internal temperature data for the custom cooling control algorithm in response to a testing routine during testing of the at least one DUT.

14. The testing apparatus of claim 7, wherein a location and a sensor type of the at least one internal temperature sensor within the at least one DUT are unrevealed outside of the at least one DUT during testing of the at least one DUT.

15. A method, comprising:
initiating performance of a testing routine on at least one DUT (device under test) wherein the at least one DUT comprises at least one internal temperature sensor integrated with electronics of the DUT;
measuring internal temperature of the at least one DUT by using the at least one internal temperature sensor to generate internal temperature data;
selectively executing between a custom cooling control algorithm and a predetermined cooling control algorithm with temperature data to obtain an algorithm result, wherein the temperature data is selectable by the custom cooling control algorithm from the internal temperature data and external temperature data of a surrounding environment external to and adjacent to the at least one DUT, and wherein the at least one internal temperature sensor is unrevealed outside of the at least one DUT;
generating a cooling control signal based on the algorithm result; and
cooling the at least one DUT based on the cooling control signal.

16. The method of claim 15, further comprising:
measuring external temperature of the surrounding environment external to and adjacent to the at least one DUT by using an external temperature sensor to generate the external temperature data, and executing the custom cooling control algorithm with the internal temperature data and the external temperature data to obtain the algorithm result.

17. The method of claim 15, wherein said measuring internal temperature comprises:
in response to the testing routine, outputting the internal temperature data from the at least one DUT and making available the internal temperature data for the cooling control algorithm.

18. The method of claim 15, wherein said initiating performance of a testing routine comprises:
setting the cooling control algorithm to be one of the custom cooling control algorithm or the predetermined cooling control algorithm.

19. The method of claim 15, wherein a location and a sensor type of the at least one internal temperature sensor within the at least one DUT are unrevealed outside of the at least one DUT by said initiating performance, said measuring internal temperature, said measuring external temperature, said generating a cooling control signal, and said cooling.

* * * * *